US009507256B2

(12) United States Patent
Seki et al.

(10) Patent No.: US 9,507,256 B2
(45) Date of Patent: Nov. 29, 2016

(54) IMPRINT METHOD, IMPRINT APPARATUS, AND PROCESS FOR PRODUCING CHIP

(75) Inventors: Junichi Seki, Yokohama (JP); Nobuhito Suehira, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 319 days.

(21) Appl. No.: 12/894,450

(22) Filed: Sep. 30, 2010

(65) Prior Publication Data

US 2011/0042348 A1    Feb. 24, 2011

Related U.S. Application Data

(62) Division of application No. 11/548,525, filed on Oct. 11, 2006, now Pat. No. 7,828,984.

(30) Foreign Application Priority Data

Oct. 18, 2005  (JP) .................................. 2005-302747
Sep. 8, 2006  (JP) .................................. 2006-244326

(51) Int. Cl.
*C23C 16/00* (2006.01)
*G03F 7/00* (2006.01)
*B29C 43/56* (2006.01)
(Continued)

(52) U.S. Cl.
CPC .............. *G03F 7/0002* (2013.01); *B29C 43/56* (2013.01); *B82Y 10/00* (2013.01); *B82Y 40/00* (2013.01)

(58) Field of Classification Search
CPC .... H05K 3/00; H05K 3/0091; H05K 3/0008; B82Y 10/00; B82Y 40/00; B29C 43/56; B29C 2043/563; G03F 9/042; G03F 7/0002

USPC ............ 118/301, 641, 642, 667, 50, 51, 58, 118/102, 630, 670, 683, 692, 723 R, 725, 118/728; 425/355, 405, 383, 470; 216/41, 216/44, 52, 300, 430

See application file for complete search history.

(56) References Cited

U.S. PATENT DOCUMENTS

| | | | |
|---|---|---|---|
| 5,772,905 A | 6/1998 | Chou | 216/44 |
| 6,334,960 B1 | 1/2002 | Wilson et al. | 216/52 |
| 6,551,720 B2 * | 4/2003 | Sreeram et al. | 428/469 |

(Continued)

FOREIGN PATENT DOCUMENTS

| | | |
|---|---|---|
| DE | 3724996 A1 | 2/1989 |
| WO | WO 2005/054948 A2 | 6/2005 |

OTHER PUBLICATIONS

International Technology Roadmap for Semiconductors, ITRS 2004 Update, Modeling and Simulation.

(Continued)

*Primary Examiner* — Lan Vinh
(74) *Attorney, Agent, or Firm* — Fitzpatrick, Cella, Harper & Scinto

(57) ABSTRACT

An imprint method for imprinting an imprint pattern of a mold onto a pattern formation material on a substrate so as to realize a high throughput includes the steps of bringing the imprint pattern and the pattern formation material into contact with each other; applying a first pressure between the mold and the substrate to increase a contact area between the imprint pattern and the pattern formation material; and adjusting a positional relationship between the mold and the substrate at a second pressure lower than the first pressure.

18 Claims, 8 Drawing Sheets

(51) Int. Cl.
*B82Y 10/00* (2011.01)
*B82Y 40/00* (2011.01)

(56) References Cited

U.S. PATENT DOCUMENTS

| | | | |
|---|---|---|---|
| 6,696,220 | B2 | 2/2004 | Bailey et al. ............... 430/272.1 |
| 6,719,915 | B2 | 4/2004 | Wilson et al. .................. 216/44 |
| 7,150,622 | B2 * | 12/2006 | Choi et al. ..................... 425/385 |
| 7,165,957 | B2 | 1/2007 | Montelius et al. ........... 425/149 |
| 7,695,667 | B2 * | 4/2010 | Best ...................... B82Y 10/00 264/335 |
| 7,789,647 | B2 * | 9/2010 | Kawakami ............. B82Y 10/00 425/149 |
| 2004/0021254 | A1 | 2/2004 | Sreenivasan et al. ........ 264/406 |
| 2004/0170771 | A1 | 9/2004 | Bailey et al. ............... 427/421.1 |
| 2005/0061773 | A1 | 3/2005 | Choi et al. ...................... 216/44 |
| 2005/0116370 | A1 * | 6/2005 | Ogino et al. ................. 264/40.1 |
| 2005/0184436 | A1 * | 8/2005 | Jeong et al. .................. 264/496 |
| 2005/0221579 | A1 | 10/2005 | Matsumoto ................... 438/424 |
| 2005/0221597 | A1 | 10/2005 | Koning ........................ 438/612 |
| 2005/0275125 | A1 * | 12/2005 | Kawakami et al. ......... 264/40.5 |
| 2006/0043626 | A1 * | 3/2006 | Wu et al. ...................... 264/101 |
| 2007/0056680 | A1 | 3/2007 | Tan et al. ...................... 156/232 |
| 2008/0047932 | A1 | 2/2008 | Terasaki et al. ................ 216/41 |
| 2008/0211133 | A1 | 9/2008 | Terasaki et al. .............. 264/219 |
| 2008/0292976 | A1 | 11/2008 | Terasaki et al. .................. 430/5 |

OTHER PUBLICATIONS

Stephen Y. Chou et al., "Imprint of sub-25 nm vias and trenches in polymers," Appl. Phys. Lett., vol. 67, No. 21, pp. 3114-3116 (Nov. 20, 1995).

M. Colburn et al., "Step and Flash Imprint Lithography: A New Approach to High-Resolution Patterning," Emerging Lithographic Technologies III, Proceedings of SPIE, vol. 3676, Part One of Two Parts, pp. 379-389 (Mar. 1999).

International Technology Roadmap for Semiconductors, ITRS 2004 Update, Overview and Summaries.

International Technology Roadmap for Semiconductors, ITRS 2004 Update, Overall Roadmap Technology Characteristics.

International Technology Roadmap for Semiconductors, ITRS 2004 Update, Design.

International Technology Roadmap for Semiconductors, ITRS 2004 Update, Test and Test Equipment.

International Technology Roadmap for Semiconductors, ITRS 2004 Update, Process Integration, Devices, and Structures.

International Technology Roadmap for Semiconductors, ITRS 2004 Update, RF and Analog/Mixed-signal Technologies for Wireless Communications.

International Technology Roadmap for Semiconductors, ITRS 2004 Update, Emerging Research Devices.

International Technology Roadmap for Semiconductors, ITRS 2004 Update, Front End Process.

International Technology Roadmap for Semiconductors, ITRS 2004 Update, Lithography.

International Technology Roadmap for Semiconductors, ITRS 2004 Update, Interconnect.

International Technology Roadmap for Semiconductors, ITRS 2004 Update, Factory Integration.

International Technology Roadmap for Semiconductors, ITRS 2004 Update, Assembly and Packaging.

International Technology Roadmap for Semiconductors, ITRS 2004 Update, Environment, Safety, and Health.

International Technology Roadmap for Semiconductors, ITRS 2004 Update, Yield Enhancement.

International Technology Roadmap for Semiconductors, ITRS 2004 Update, Metrology.

* cited by examiner

IMPRINT METHOD, IMPRINT APPARATUS, AND PROCESS FOR PRODUCING CHIP

CROSS REFERENCE TO RELATED APPLICATION

This application is a division of U.S. application Ser. No. 11/548,525, filed on Oct. 11, 2006, the entire disclosure of which is hereby incorporated by reference herein.

FIELD OF THE INVENTION AND RELATED ART

The present invention relates to an imprint method, an imprint apparatus, and a process for producing a chip by using the imprint apparatus.

In recent years, e.g., as proposed in Appl. Phys. Lett., Vol. 67, Issue 21, pp. 3114-3116 (1995) by Stephan Y. Chou et al., fine processing technology for transferring a minute structure having an imprint pattern provided on a mold onto a work (or workpiece) such as a semiconductor, glass, resin or metal has been developed and has received attention. This technology is called nanoimprint or nanoembossing since it can be expected to realize a resolution on the order of several nanometers. Further, the nanoimprint technology is capable of forming a three-dimensional structure on a wafer at the same time, so that in addition to semiconductor fabrication technology, the technology has been expected to be applied to production technologies of optical devices such as photonic crystal, and production technologies of μ-TAS (Micro Total Analysis System) and biochips.

As the nanoimprint technology, in Proceedings of the SPIE's 24th International Symposium on Microlithography: Emerging Lithographic Technologies III, Santa Clara, Calif., Vol. 3676, Part One, pp. 379-389, March (1999), a transfer technology of a minute structure on a mold onto a work performed in the following manner has been described.

First, the minute structure is formed at a surface of a quartz substrate to prepare the mold.

Further, the work is prepared by applying a liquid ultraviolet (UV) curable resin material dropwise onto a processing area of a substrate.

Next, the mold is pressed against the work to fill the UV curable resin material in a spacing between the mold and the substrate. Thereafter, the resultant structure is irradiated with UV light to cure the UV curable resin material.

Finally, the mold is removed from the work to complete the transfer of the minute structure.

When the above described processing technology using the nanoimprint is industrially applied to processing technologies, an improvement in throughput is an important factor. Particularly, it has been pointed out that a step of filling the resin material in the spacing between the mold and the substrate is very time consuming.

The reason why the resin material filling step requires a long time will be described more specifically.

A thickness of a resist pattern conventionally formed by a light exposure apparatus varies depending on a line-width rule or an influence of another process but may generally be in the range from about several tens of nm to about several hundreds of nm.

When the fine processing technology using the nanoimprint described above is applied to the semiconductor fabrication, a resin layer after processing is utilized in place of the resist pattern of the above described light exposure apparatus. In this case, it is difficult to largely change the thickness of the resin layer from the value of the thickness of the resist pattern to which the above described line-width rule is applied, in order to ensure a strength of the minute structure or suppress the influence thereof on another step such as etching.

For example, in the case where the resin layer has a thickness of 100 nm and the mold has a size of 20 mm square, a spacing between the mold and the substrate includes a large space having an aspect ratio of 1:50000. For this reason, when the resin material flows in the space, a large resistance is caused to result in a long time for the filling of the resin material.

In order to reduce the resin material filling time, it can be considered, e.g., that a viscosity of the resin material is lowered and that a coating method is appropriately modified. However, the fact of the matter is that the improvements only by the viscosity and the coating method have still required a long filling time of the resin material.

SUMMARY OF THE INVENTION

In view of the above described problem, an object of the present invention is to provide an imprint method and an imprint apparatus which are capable of realizing a high throughput.

Another object of the present invention is to provide a process for producing a chip by using the imprint apparatus.

According to a first aspect of the present invention, there is provided an imprint method for imprinting an imprint pattern of a mold onto a pattern formation material on a substrate, the imprint method comprising:

bringing the imprint pattern and the pattern formation material into contact with each other;

applying a first pressure between the mold and the substrate to increase a contact area between the imprint pattern and the pattern formation material; and adjusting a positional relationship between the mold and the substrate at a second pressure lower than the first pressure.

According to a second aspect of the present invention, there is provided an imprint apparatus for imprinting an imprint pattern of a mold onto a pattern formation material on a substrate, the imprint apparatus comprising:

a mold holding portion for holding the mold;

a substrate stage for mounting the substrate thereon;

a detection portion for detecting a pressure or a load applied between the mold and the substrate;

a pressure control portion for controlling the pressure applied between the mold and the substrate;

a position adjusting portion for adjusting a positional relationship between the mold and the substrate; and an information acquisition portion for acquiring information about a contact state between the imprint pattern and the pattern formation material on the substrate;

wherein the pressure control portion is capable of setting values of a first pressure and a second pressure lower than the first pressure and changes a pressure set value from the first pressure value to the second pressure value on the basis of the information from the information acquisition portion.

According to a third aspect of the present invention, there is provided a process for producing a chip, comprising:

preparing the imprint apparatus described above;

imprinting an imprint pattern of a mold onto a pattern formation material on a substrate; and effecting etching of the substrate using the pattern formation material as a mask.

According to a fourth aspect of the present invention, there is provided an imprint method for curing a resin material interposed between a mold and a substrate from at least one of the mold side and the substrate side, the imprint method comprising: curing the resin material by applying thereto pulse-like energy so as to imprint an imprint pattern of the mold onto the resin material.

According to a fifth aspect of the present invention, there is provided an imprint method for imprinting an imprint pattern of a mold onto a pattern formation material on a substrate, the imprint method comprising:

bringing the imprint pattern and the pattern formation material into contact with each other;

applying a first load between the mold and the substrate to increase a contact area between the imprint pattern and the pattern formation material; and adjusting a positional relationship between the mold and the substrate at a second load smaller than the first load.

According to the present invention, it is possible to realize a high throughput in the imprint method, the imprint apparatus, and the chip production process described above.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

First Embodiment

Imprint Method

An imprint method according to First Embodiment of the present invention will be described with reference to FIGS. 1A to 1D.

Figure 1A:
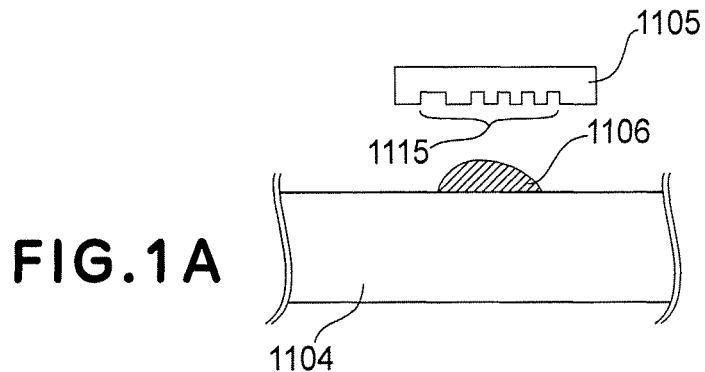
FIGS. 1A to 1D are schematic views for illustrating an imprint method according to First Embodiment of the present invention.

Referring to FIG. 1A, a pattern formation material 1106 onto which an imprint pattern 1115 of a mold 1105 is to be imprinted is disposed on a substrate 1104. The mold 1105 and the substrate 1104 are disposed opposite to each other and a distance therebetween is gradually decreased, with the result that the mold 1105 and the pattern formation material 1106 contact each other.

Figure 1B:
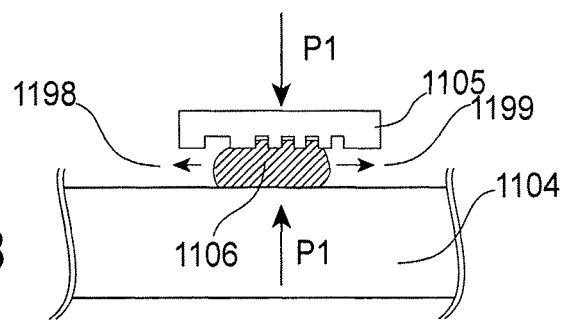
Figure 1C:
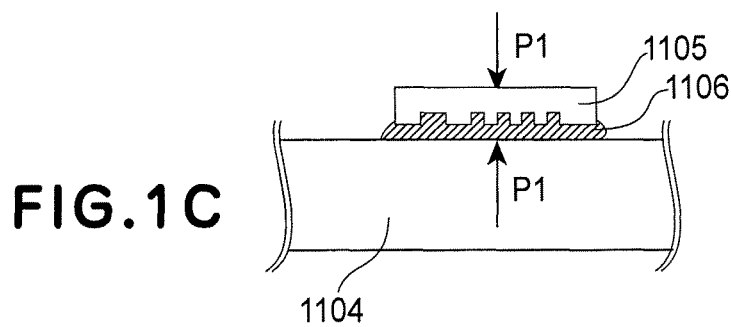

Thereafter, a pressure P1 is applied between the mold 1105 and the substrate 1104, whereby a contact area of the pattern formation material 1106 with the imprint pattern 1115 is increased (FIGS. 1B and 1C). In FIG. 1B, arrows 1198 and 1199 represent an example of directions in which the contact area is to be increased.

Incidentally, in this embodiment, the increase in contact area includes not only the case where the contact area is extended in an in-plane direction as shown in FIG. 1B but also the case where the pattern formation material is filled in a depth direction of a recess of the imprint pattern 1115 of the mold 1105.

Figure 1D:
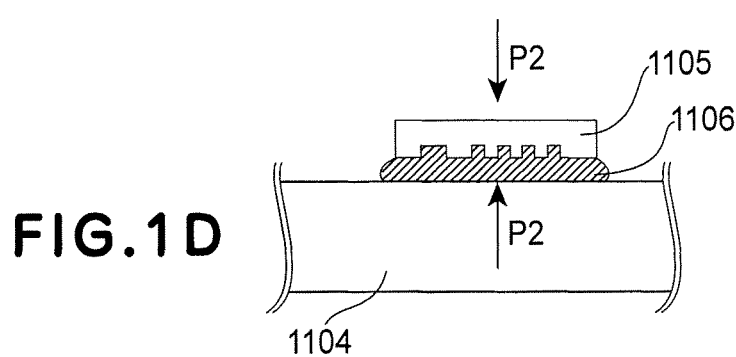

Then, in a state in which the pressure P1 is lowered to P2(<P1), a positional relationship between the substrate 1104 and the mold 1105 is adjusted (FIG. 1D).

In this embodiment, the pressure P2 during the positional adjustment of the substrate 1104 with the mold 1105 is lower than the pressure P1 until the contact area between the imprint pattern 1115 and the pattern formation material 1106 on the substrate 1104 is sufficiently ensured. As a result, it is possible to effect positional alignment between the mold and the substrate with high accuracy while reducing the time required for filling the pattern formation material in the spacing between the mold and the substrate. More specifically, with respect to the pressure during the filling of the resin material in the spacing between the mold and the substrate, the pressure during the positional adjustment is made lower than a maximum pressure during the filling, whereby a high throughput and high-accuracy alignment can be compatibly realized.

This is attributable to pressure control such that pressure application can be performed separately in a filling period wherein the resin material is filled at high speed by applying thereto a high pressure and in an alignment exposure period wherein an alignment step and a resin material curing step (including light exposure step or heating step) are performed at a low pressure with high accuracy.

(A: First Pressure, Second Pressure)

Here, settings of pressures may, e.g., be effected in the following manner.

First, during the increase in contact area between the imprint pattern 1115 and the pattern formation material 1106, the first pressure P1 is increased and the second pressure is decreased so that it is lower than the first pressure after being increased. This state is shown in FIG. 2A, in which an ordinate represents a pressure or load exerted between the mold and the substrate.

Figure 2A:
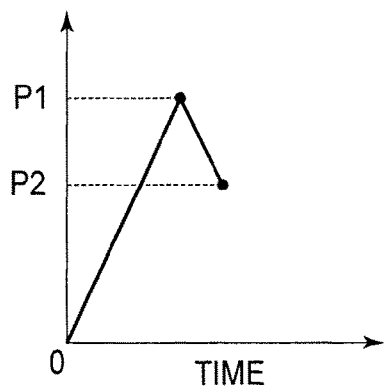
FIGS. 2A to 2C are graphs each showing a change in pressure with time during imprinting in First Embodiment of the present invention.

From the instant of contact of the mold (imprint pattern), the pattern formation material, and the substrate, the pressure or load measured on the substrate side or the mold side is increased as shown in FIG. 2A. In this case, the spacing between the mold and the substrate is actually decreased gradually. Consequently, the pressure exerted between the mold and the substrate reaches P1.

Thereafter, in order to effect the positional adjustment (alignment) between the mold and the substrate, the pressure is lowered to P2. In this case, it is also possible to lower the pressure to P2 after the pressure is kept at P1 for a certain period (t2 shown in FIG. 2B).

Incidentally, in order to lower the pressure, the pattern formation material interposed at the spacing between the mold and the substrate is further extended while keeping the spacing at a constant level from a state in which the pressure reaches P1, so that it is possible to lower the pressure to P2.

Further, it is also possible to lower the pressure to P2 by relatively moving the mold and the substrate away from each other. Further, the pressure value P1 may also be kept at a constant level during the increase in contact area between the imprint pattern 1115 and the pattern formation material 1106. In other words, the set pressure value P1 may also be fixed. It is also possible to apply a certain load directly or indirectly to the substrate or the mold during the contact area increase.

Incidentally, with respect to a relationship between P1 and P2, it is not particularly limited so long as it satisfies P2<P1 but may also be set so that P2 satisfies the relationship: 0.3P1<P2<0.7P1.

The first pressure P1 may, e.g., be 5 times or less, preferably 3 times or less, more preferably 1.5 times or less, of the second pressure P2. Further, as an absolute value of P1, it can be set so as to be, e.g., 0.1 MPa or more and 10 MPa or less.

The value of P2 can be set so as to be −0.1 MPa or more and 0.1 MPa or less.

Incidentally, when the adjustment of the mold with the substrate in the in-plane direction is effected, the measured pressure value may also be a negative value.

Further, the present invention also includes the case where a relationship between the first and second pressure values satisfies the above described relationship even when only the adjustment of load is effected without controlling the pressure value itself.

Figure 2B:
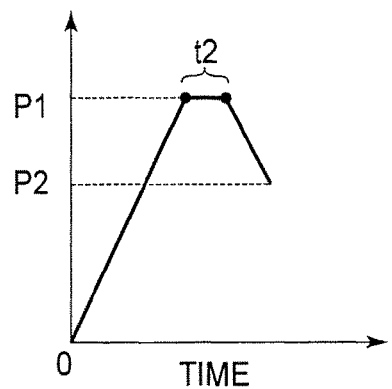

In FIGS. 2A and 2B, the cases where the pressure is linearly changed until it reaches P1 are described. However, it is also possible to realize the pressure P1 while causing a stepwise or vibratory change of the pressure by controlling a gap (spacing) between the mold and the substrate. For example, during the increase in contact area between the imprint pattern and the pattern formation material, the first pressure described above repeatedly increases and decreases and the second pressure described above can be lower than the first pressure at the time of increase.

Figure 2C:
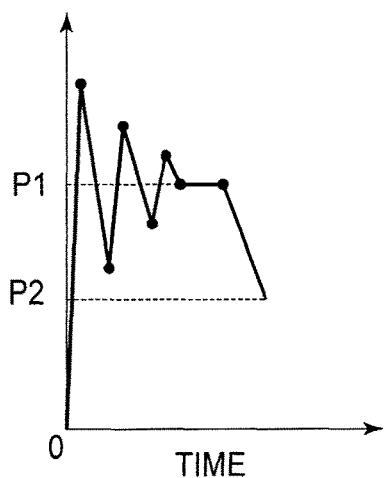

The pressure value may also be caused to reach P1 through a pressure change as shown in FIG. 2C.

Incidentally, in order to oscillate the pressure exerted between the mold and the substrate until the pressure value reaches P1, the positional relationship between the mold and the substrate may be controlled so as to oscillate the spacing (gap) therebetween. Further, it is also possible to utilize ultrasonic vibration or the like.

In the case of utilizing the ultrasonic vibration, the ultrasonic vibration is imparted directly or indirectly to at least one of the substrate and the mold. It is also possible to impart the vibration to the resin material itself.

Further, after the first pressure P1 is applied between the mold and the substrate and before the second pressure P2 is applied therebetween, it is also possible to alleviate a pressing force by applying a pressure lower than the second pressure or applying a negative pressure therebetween.

Further, by bringing the imprint pattern and the pattern formation material into contact with each other, it is also possible to change the pressure applied between the mold and the substrate in a pulse-like manner during the increase in contact area.

In the case of applying the pulse-like pressure application, a period (time cycle) thereof can be, e.g., several microseconds to several tens of seconds, preferably several seconds or less. More preferably, the period is several milliseconds to several tens of seconds. Here, the several milliseconds may, e.g., be two or three milliseconds.

In such an intermittent pressing method, a force applied to the resin material is released temporarily particularly in the case of large inertia of the resin material (e.g., in the case of a low viscosity of the resin material). Accordingly, from the viewpoint of controllability of the gap between the substrate and the mold, it is preferable that such a pulse-like pressure application is effected.

Incidentally, a pressure at the time when desired filling is performed may also be taken as P1 while measuring or observing an amount of filling (or contact area) of the pattern formation material filled between the substrate and the mold without exerting the load between the substrate and the mold so as to provide a certain pressure P1 in advance.

For example, when the imprint is effected in a plurality of areas on the substrate by step-and-repeat method, the pressure value P1 itself can vary depending on an imprint position. It is possible to appropriately select control based on a filling status of the pattern formation material or control by the pressure value. It is possible to reduce variation in filling time by constituting the pressing method so that the filling status or state of the resin material as the pattern formation material is detected through optical observation to effect switching between the filling period and the alignment exposure period.

Further, adjustment or control of the pressure is effected by moving the substrate in a direction perpendicular to a processing surface of the mold on the basis of the spacing between the substrate and the mold and results preliminarily calculated with respect to the pattern formation material used (or estimated results or inputted data table). When the pressure value is controlled to a certain pressure value, e.g., the following adjustment or control is effected.

First, a data table storing information about a correlation between the spacing between the substrate and the mold and a desired pressure value is prepared. Then, information about a length (distance) of the spacing corresponding to a certain pressure value is acquired.

Next, the mold and the substrate are relatively moved in a pressure axis direction so as to provide the length of the spacing therebetween, thus obtaining a predetermined pressure value.

It is also preferable that the pressure or the load is directly measured by a load cell which is a load converter for converting a weight of object (load) into an electrical signal.

As described above, this embodiment of the present invention is characterized in that the pressure (or load) exerted on the resin material during the alignment of the mold with the substrate is smaller than the pressure (or load) exerted on the resin material during the increase in contact area between the resin material and the imprint pattern.

The alignment will be described below in detail.

Incidentally, the load or the pressure can be detected by utilizing a sensor or piezoelectric element such that a resistance value or a capacitance is changed depending on the pressure or the load.

(B: Positional Adjustment Between Mold and Substrate)

Next, the positional adjustment between the mold and the substrate in this embodiment will be described. During the above described positional adjustment between the mold and the substrate, as shown in FIG. 1D, the positional adjustment between the mold 1105 (exactly the imprint pattern 1115) and the substrate 1104 is effected in a state of pressure P2.

Herein, the positional adjustment includes, e.g., the following alignments (1) to (3).

(1) Adjustment of a positional relationship between the mold and the substrate in an in-plane direction perpendicular to the pressing axis of the first pressure P1 (so-called in-plane direction alignment)

Incidentally, the alignment can include those with respect to rotation of the substrate and the mold about the pressing axis. For example, alignments with respect to x-axis, y-axis, and an angle θ when the pressing axis is the z-axis are included. The angle θ is an angle with respect to z-axis.

(2) Adjustment with respect to the gap between the mold and the substrate in a direction parallel to the pressing axis of the first pressure P1 (gap adjustment)

(3) Alignment of surfaces of the mold and the substrate with respect to α (an angle with respect to the x-axis) and β (an angle with respect to the y-axis)

Incidentally, the resin material as the pattern formation material is cured while controlling a position of at least one of the mold and the substrate so as to retain a positional relationship between the mold and the substrate after the positional relationship is adjusted. Further, during the positional adjustment, it is also possible to effect feedback control such that the pressure P2 is controlled so as not to fluctuate or that the gap between the mold and the substrate is controlled so that the pressure value does not exceed P2. It is further possible to effect only the positional adjustment without effecting the control such that the pressure P2 is maintained.

The positional adjustment can be performed specifically, e.g., in the following manner.

From a positional relationship between alignment marks provided on the mold side and the substrate side, a position with respect to XY-plane is adjusted (XY-adjustment).

By effecting the XY-adjustment at a plurality of points (a plurality of different areas), the angle (θ) with respect to the z-axis is adjusted.

Next, the gap between the mold and the substrate (a distance therebetween in the z-axis direction) is adjusted by optical interference between the mold and the substrate.

This gap adjustment is effected at a plurality of points to adjust α (angle with respect to x-axis) and β (angle with respect to y-axis).

Further, it is also possible to decrease the gap between the substrate and the mold again after the alignment of the substrate with the mold, in the in-plane direction in a state of the pressure P2. In this case, it is possible to decrease a thickness of a residual film of pattern formation material (e.g., the resin material) interposed between a projection of the imprint pattern and the substrate.

In the case where the in-plane direction alignment is effected in a state in which the residual film has a very small thickness, there is a possibility that the substrate surface or the imprint pattern is damaged.

However, it is preferable that a gap-decreasing step is performed after the in-plane direction alignment is effected in a state in which a residual film is somewhat ensured.

More specifically, (a) the gap is decreased so that the contact area between the imprint pattern and the resin material is in a desired range and thereafter, (b) the in-plane direction alignment is effected and again, (c) the step of decreasing the gap is effected.

(C: Pattern Formation)

In this embodiment of the present invention, pattern formation is effected in the following manner.

After the positional relationship between the mold and the substrate is adjusted, the resin material or the like as the pattern formation material is cured to effect the pattern formation. Thereafter, a removal step for removing the pattern formation material and the mold from each other is effected.

(D: Mold (Template))

Next, the mold (template) according to this embodiment will be described.

In this embodiment, the mold has a surface imprint pattern (including a recess and a projection). The imprint pattern can be prepared by forming a recess and a projection on the mold itself.

In this case, the recess and projection of the mold are imprinted onto the pattern formation material, as a member to be processed, on the substrate.

Incidentally, it is also possible to bring the mold and the member to be processed into indirect contact with each other via a release agent which has been applied onto the imprint pattern of the mold. In other words, in this embodiment of the present invention, the contact of the mold (or the imprint pattern) with the pattern formation material (e.g., a photocurable resin material) also includes the case of the indirect contact therebetween via the release agent.

The mold can be constituted by a material including glass, such as quartz or the like, metal, silicon, etc. Further, the imprint pattern may, e.g., be formed by electron beam lithography.

(E: Substrate and Pattern Formation Material)

Next, the substrate and the pattern formation material according to this embodiment will be described.

As the substrate, it is possible to use semiconductor substrates including Si substrate, GaAs substrate, etc.; resin substrate; quartz substrate; glass substrate; etc. It is also possible to use a light-transmissive substrate such as quartz substrate. The substrate in this embodiment also includes a multi-layer film substrate comprising a plurality of thin films formed on a substrate.

Further, as the pattern formation material, it is possible to use, e.g., the photocurable resin material.

In order to cure the photocurable resin material applied onto the substrate, e.g., the photocurable resin material is irradiated with, e.g., ultraviolet (UV) rays from the mold side.

Examples of the photocurable resin material may include those of urethane-type, epoxy-type, acrylic-type, etc. For example, low-viscosity UV curable resin materials such as HDDA (1,6-hexanediol-diacrylate) and HEBDM (bis(hydroxyethyl)bisphenol-A dimethacrylate) have been known.

The light irradiation itself may also be effected from the substrate side when a transparent substrate is used.

Further, as the pattern formation material, it is also possible to use thermosetting resin materials such as phenolic resin, epoxy resin, silicon resin, and polyimide, and thermoplastic resins such as polymethyl methacrylate (PMMA), polycarbonate (PC), polyethylene terephthalate (PET), and acrylic resin. Whether or not the resin material is the thermosetting resin material can be determined by a polymerization mechanism of the above-described phenolic resin or the like.

It is also possible to effect pattern formation by performing heat treatment as desired.

Further, as the pattern formation material, it is also possible to utilize silver paste, a low-melting point metal material containing indium, etc.

Incidentally, when the resin material is disposed on the substrate, it is possible to place the resin material on the substrate in each area, in which the imprint is effected, by a dispenser described later. Further, it is also possible to repeatedly perform the imprint step after the resin material is applied onto the entire surface of the substrate by spin coating in advance. Incidentally, in FIG. 1A, the pattern formation material 1106 applied onto the substrate is depicted in bulk but it is merely an example. For another example, the cases where the resin material is disposed on the substrate in a plurality of small dot-like shapes and where it is disposed on the entire surface of the substrate in a layer-like shape may also be embraced in the present invention.

The above described technical factors or members A to E in First Embodiment may also be applicable to all the embodiments of the present invention. Further, the entire disclosure of U.S. Pat. Nos. 6,696,220; 6,719,915; 6,334,960; and 5,772,905 and U.S. patent application Ser. No. 10/221,331 is expressly incorporated herein by reference so long as it is consistent with the embodiments of the present invention.

Incidentally, the imprint method of the present invention is particularly applicable to formation of a pattern having a recess and a projection on the order of nanometers to micrometers. For example, the imprint method can be suitably used for pattern formation with a pitch of several nanometers to several hundreds of nanometers.

Further, as will be described in embodiments later, it is also possible to provide a pressure relaxation (alleviation) period between the filling period and the positional adjustment period or between the filling period and the exposure period.

Further, it is preferable that pressures in the exposure period and the positional adjustment period are equal to each other or different from each other within ±15%. This is because there is a possibility that a change in position is caused due to the change in pressure.

Second Embodiment

Imprint Apparatus

Figure 3:
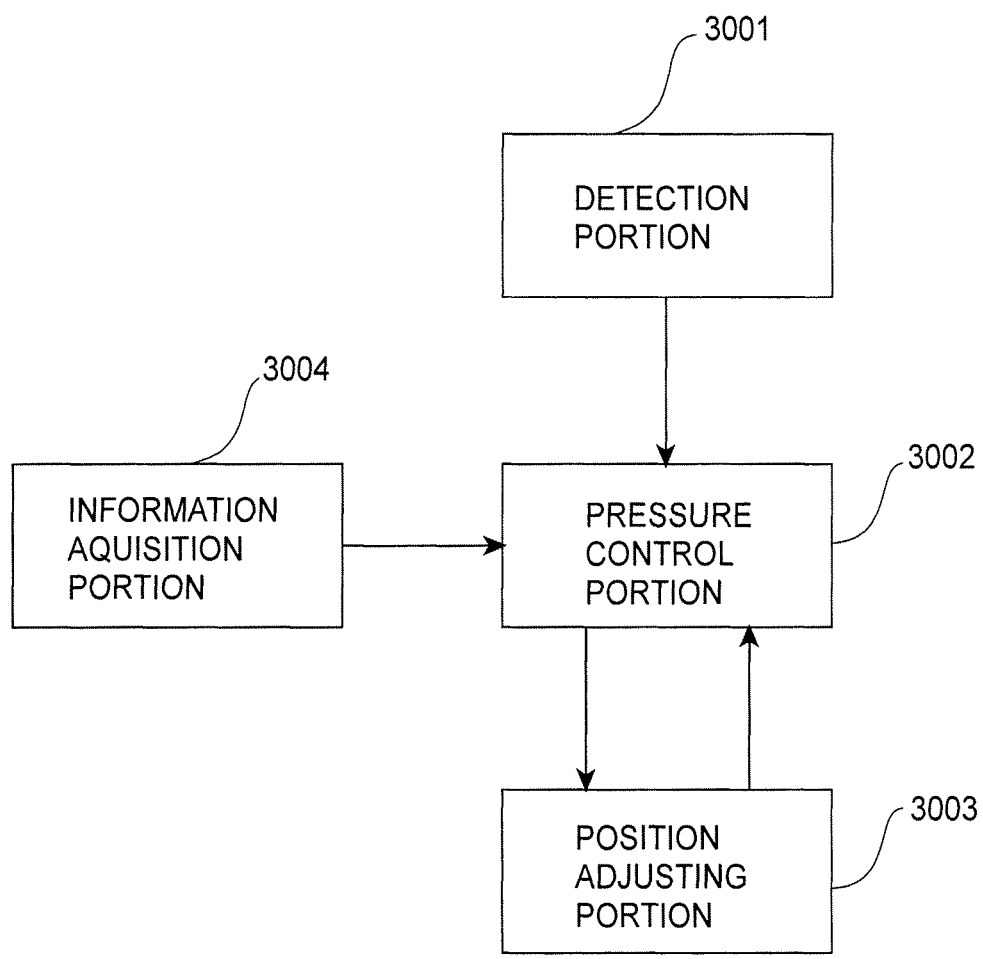
FIG. 3 is a block diagram for illustrating an imprint apparatus according to Second Embodiment of the present invention.

Next, the imprint apparatus according to Second Embodiment of the present invention will be described with reference to FIG. 3.

Herein, the imprint apparatus means such an imprint apparatus that the imprint pattern of the mold is imprinted onto the pattern formation material on the substrate and includes at least the following apparatus members or portions.

More specifically, the imprint apparatus includes a mold holding portion for holding the mold and a substrate stage for mounting thereon the substrate. The mold holding portion includes a chucking mechanism for chucking the mold.

The imprint apparatus further includes a detection portion 3001 for detecting the pressure or load exerted between the mold and the substrate, a pressure control portion 3002 for controlling the pressure exerted between the mold and the substrate, a position adjusting portion 3003 for adjusting the positional relationship between the mold and the substrate, and an information acquisition portion 3004 for acquiring information about a contact state of the imprint pattern with the pattern formation material. Here, the pressure control portion 3002 includes a load control portion for controlling the load.

The detection portion 3001 may be disposed on one of the mold side and the substrate stage side but may also be disposed on both sides.

From the detection portion 3001, data as to the pressure or load exerted between the substrate and the mold are inputted into the pressure control portion 3002.

The information acquisition portion 3004 acquires information about the contact state of the imprint pattern with the pattern formation material from an optical observation apparatus such as a microscope and input the acquired information into the pressure control portion 3002.

Here, the information inputted from the information acquisition portion 3004 into the pressure control portion 3002 may also be time information in place of the above described information from the optical observation apparatus. Herein, the time information is, e.g., a time period from the time when the resin material, the imprint pattern of the mold, and the substrate are brought into contact with each other.

From the time of contact, a detected value in the detection portion 3001 is changed, so that data from the detection portion 3001 are configured to be inputted into the information acquisition portion 3004. As a result, at the time when a predetermined time has elapsed from the time of contact, it is possible to input the time information from the information acquisition portion 3004 into the pressure control portion 3002.

The time information is also useful empirically in the case where a time until the resin material as the pattern formation material and the imprint pattern are brought into desired contact with each other has already been known.

The pressure control portion 3002 determines as to whether the pressure value or the like detected at the detection portion 3001 should be maintained, increased, decreased, or not controlled, and on the basis of the determination, provides instructions to the position adjusting portion 3003. The position adjusting portion 3003 includes a gap control circuit and gap adjusting mechanism (or load adjusting mechanism) which are used for adjusting the gap according to the instructions from the pressure control portion 3002. The position adjusting portion 3003 further includes a position control circuit in an in-plane direction and an alignment adjusting mechanism in the in-plane direction.

In this embodiment, the above described pressure control portion 3002 is characterized in that the set values of the first and second pressures are settable.

The change of pressure set value from the first pressure set value to the second pressure set value lower than the first pressure set value is effected on the basis of information from the information acquisition portion 3004. After the pressure value is lowered to the second set value, the alignment control in the in-plane direction is effected by the alignment adjusting mechanism of the position adjusting portion 3003.

Incidentally, when the imprint apparatus includes, as a whole, the position control circuit in the in-plane direction and the alignment adjusting mechanism in the in-plane direction, all these members are not necessarily incorporated in the position adjusting portion 3003.

The adjustment of the positional relationship between the mold and the substrate by the position adjusting portion 3003 may preferably be effected at the above described second pressure set value or less. After the alignment step in the in-plane direction is performed, energy irradiation from an energy source (e.g., UV light source) for curing the above described pattern formation material may preferably be effected at the second pressure set value or less.

Incidentally, the imprint apparatus is described later more specifically in Embodiments of the present invention.

Third Embodiment

Chip Production Process

Next, a process for producing a chip according to Third Embodiment of the present invention will be described.

In the chip production process of this embodiment, as the imprint apparatus, it is possible to utilize the imprint apparatus used in Embodiments described later.

More specifically, the imprint pattern of the mold is imprinted onto the pattern formation material (e.g., the photocurable resin material). The photocurable resin material after the imprint pattern is imprinted thereon by energy irradiation with UV rays or the like ordinarily loses its photocurable property.

Thereafter, etching of the substrate (e.g., silicon substrate) is effected by using the pattern formation material as a mask.

Incidentally, it is also possible to remove a portion of the resin material at the recess formed on the resin material (herein, this portion is referred to as a "residual film") by ashing (oxygen reactive etching), as desired, depending on the thickness of the residual film.

As described above, it is possible to form various patterns on the substrate including a thin film of silicon or oxides. In other words, by introducing the imprint step into a production process in place of the lithography step in the ordinary semiconductor process, it is possible to produce a so-called semiconductor chip including a transistor or a memory. Incidentally, the chip includes not only semiconductor products but also a biochip prepared by forming flow paths or the like on a quartz substrate.

Fourth Embodiment

Pulse Energy Irradiation

In the imprint method according to the fourth aspect of the present invention, pulse-like energy (light or heat) is applied to the resin material interposed between the mold and the member to be processed such as a wafer to control a curing state of the resin material. For example, an electrically conductive film is disposed at a back surface or inside the mold and a current caused to pass through the electrically conductive film can be used as a pulse current.

Hereinafter, the present invention will be described based on Embodiments.

Embodiment 1

In Embodiment 1, a constitutional example of a pressure processing apparatus (imprint apparatus) to which the present invention is applied will be described.

Figure 4:
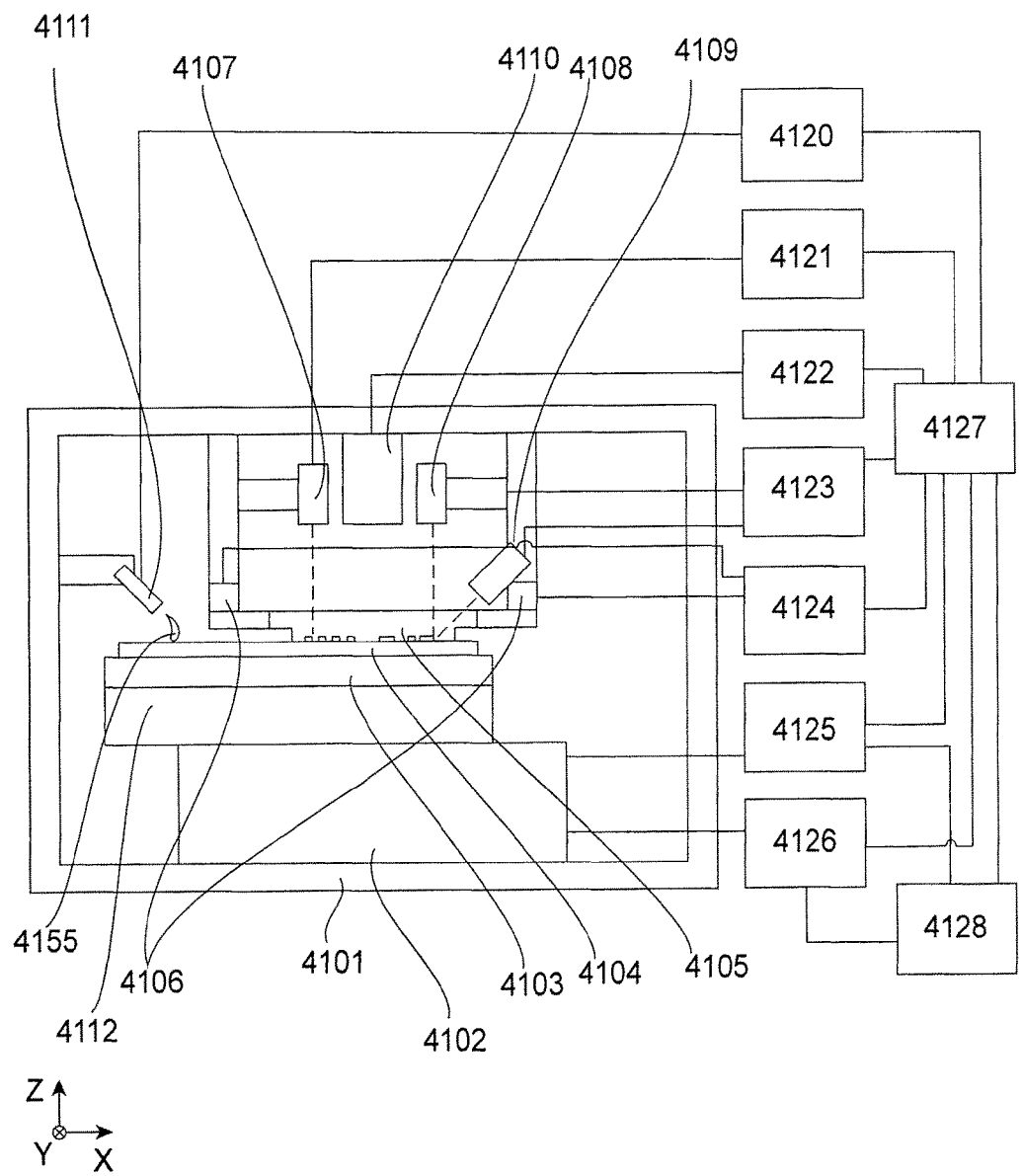
FIG. 4 is a schematic structural view showing an imprint apparatus used in Embodiment 1 of the present invention.

FIG. 4 shows the constitutional example of the pressure processing apparatus in this embodiment.

Referring to FIG. 4, the pressure processing apparatus includes a housing 4101, a stage 4102, a chuck 4103, a work (substrate) 4104, a mold 4105, a load cell 4106, a scope 4107, a laser 4108, a photodiode 4109, a UV light source 4110, a dispenser 4111, a stage moving portion 4112, an application control circuit 4120, a position detection circuit 4121, an exposure amount control circuit 4122, a filling amount detection circuit 4123, a pressure detection circuit 4124, a pressure control circuit 4125, a position control circuit 4126, a process control circuit 4127, and a filling amount control circuit 4128. Incidentally, a resin material interposed between the mold 4105 and the substrate 4104 is not shown in FIG. 4.

As shown in FIG. 4, the mold 4105 and the work (substrate) 4104 are disposed opposite to each other. The mold 4105 is formed of a transparent material and has a desired imprint pattern at a surface facing the work 4104. The mold 4105 is connected to the housing 4101 via the load cell 4106 and a member or the like. The transparent material for the mold 4105 can be appropriately selected from quartz, sapphire, $TiO_2$, SiN, etc. The surface of the mold 4105 facing the work 4104 is ordinarily subjected to release treatment by effecting treatment with a silane coupling agent or the like.

The scope 4107 is constituted by a lens system and a CCD camera and acquires, as an image, information about the mold 4105, the work 4104, and a spacing therebetween.

At a portion of the housing 4101 located opposite to the back surface of the mold 4105, the UV light source 4110 is disposed. The laser 4108 and the photodiode 4109 are disposed so that their optical axes intersect in the spacing between the mold 4105 and the work 4104. The intersection angle between the optical axes is set so that emitted light, from the laser 4108, which has been reflected by the surfaces of the mold 4105 and work 4104 does not directly enter the photodiode 4109.

The work 4104 is mounted on the stage 4102 via the chuck 4103. The stage 4102 has movable directions with respect to six axes (x, y, z, θ, α, and β) and is attached to the housing 4101.

The dispenser 4111 is attached to the housing via a supporting member in a z-direction within a movable range of the stage 4102 so that it can be located opposite to an arbitrary position on the work 4104.

The process control circuit 4127 provides instructions to the application control circuit 4120, the position detection circuit 4121, the exposure amount control circuit 4122, the filling amount detection circuit 4123, the pressure detection circuit 4124, the pressure control circuit 4125, the position control circuit 4126, and the filling amount control circuit 4128. Further, the process control circuit 4127 receives output data from the above described circuits while proceeding with a process.

The application control circuit 4120 controls the dispenser 4111 so as to apply a photocurable resin material 4155 onto the work 4104.

The exposure amount control circuit 4122 controls the UV light source to effect light exposure.

The position detection circuit 4121 image-processes the acquisition image by the scope 4107 to calculate the positional relationship between the mold 4105 and the work 4104.

The filling amount detection circuit 4123 causes the laser 4108 to emit laser light and calculate a filling amount of the resin material in the spacing between the mold 4105 and the work 4104 from a detection result by the photodiode 4109.

The pressure detection circuit 4124 calculates a pressure exerted in the spacing between the mold 4105 and the work 4104 from a detection signal of the load cell 4106 and an area of a portion to be processed.

The pressure control circuit 4125 controls the stage 4102 so that a desired pressure is exerted on the spacing between the mold 4105 and the work 4104.

The position control circuit 4126 controls the stage 4102 so that the mold 4105 and the work 4104 provide a desired positional relationship therebetween.

The filling amount control circuit 4128 provides instructions to the pressure control circuit 4125 and the position control circuit 4126 so that the filling amount of the resin material is a desired value in the spacing between the mold 4105 and the work 4104. Further, the filling amount control circuit 4128 also effects switching between the pressure control circuit 4125 and the position control circuit 4126.

Incidentally, arrangements, modes, and the like of the respective mechanisms are not limited to those described in this embodiment but may also be modified into other constitutions. For example, the mold 4105 can also be moved in place of the work 4104.

Next, a pressure processing step in this embodiment will be described.

First, the portion to be processed on the work 4104 is disposed opposite to the dispenser 4111, from which the UV curable resin material is applied onto the portion to be processed.

Next, the portion to be processed is moved so that it is opposite to the mold 4105. Then, the work 4104 and the mold 4105 are pressed against each other, so that a high pressure is applied to the spacing therebetween so as to permit high-speed filling of the resin material in the spacing.

Next, at the time when completion of the filling of the resin material is detected, the pressure is lowered so as to adjust the positional relationship between the work 4104 and the mold 4105.

Then, the resin material is irradiated with UV light (rays) to be cured in the spacing between the work 4104 and the mold 4105.

Finally, the work 4104 and the mold 4105 are moved apart from each other to remove the cured resin material from the mold 4105.

Through the above described processing steps, the surface imprint pattern of the mold 4105 is imprinted onto the resin layer on the work 4104.

Further, with respect to another portion on the work 4104, the above described processing steps are effected and by repeating this operation, it is also possible to form a plurality of imprint patterns on the work 4104 as in the case of a representative light exposure apparatus such as a stepper or a scanner.

Incidentally, the application method of the resin material is not limited to that described in this embodiment but may also be appropriately selectable. For example, it is also possible to effect application of the resin material by using another apparatus.

Further, the adjustment of positional relationship may also be continued during the UV light irradiation or in a period until the removal step in the cases where a higher processing accuracy is required and where a positional deviation of the resin material during or after the curing is problematic due to cure shrinkage of the resin material, thermal deformation of the respective members, vibrations from ambient members, etc.

Next, pressure control in this embodiment will be described with reference to FIGS. 5A to 5D, wherein an amount of control for the pressure and a change thereof with time is shown.

In FIGS. 5A to 5D, a filling period is a period for filling the resin material and an alignment exposure period is a period for effecting adjustment of the positional relationship and UV light irradiation.

A value of the pressure in each period is appropriately determined in view of balance among a resin characteristic, a strength of the mold, required accuracy, required throughput, etc. For example, the pressure value is 1 MPa in the filling period and 0.05 MPa in the alignment exposure period.

Figure 5A:
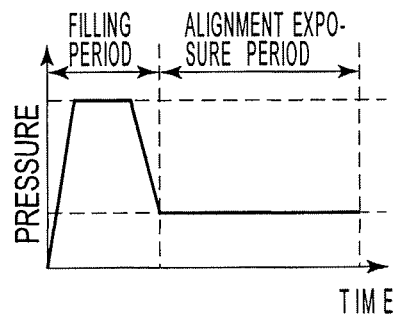
FIGS. 5A to 5D are graphs each for illustrating pressure control in Embodiment 1 of the present invention.

FIG. 5A shows an example in which a pressing step is performed by dividing an entire period for pressure control into a filling period in which the resin material is filled under application of a high pressure and an alignment exposure period in which high-accuracy alignment and curing of the resin material are performed at a low pressure. By performing such a pressing step, it is possible to realize a pressure processing apparatus (imprint apparatus) and a pressure processing method (imprint method) which are capable of providing a high throughput and high accuracy.

Figure 5B:
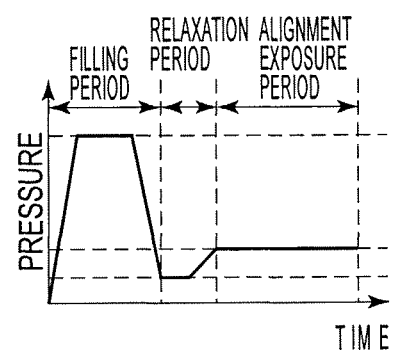

FIG. 5B shows an example in which a relaxation (alleviation) period for effecting pressure application at a pressure value lower than that in the alignment exposure period or at a negative pressing force is provided between the filling period and the alignment exposure period. In this example, e.g., it is possible to effect precise control of a filling amount of the resin material even in the case where the resin material has large inertia, so that it is possible to realize reduction in filling time under application of a higher pressure and a more precise processing shape. Further, by relaxing residual stress in the resin material, it is possible to improve a shape precision after shaping. Further, in the case where the pressure or processing result can be calculated or empirically estimated from dimensions and mechanical constants of the respective members, a liquid characteristic, etc., it is also possible to use a position as the control amount in place of the pressure actually measured.

Figure 5C:
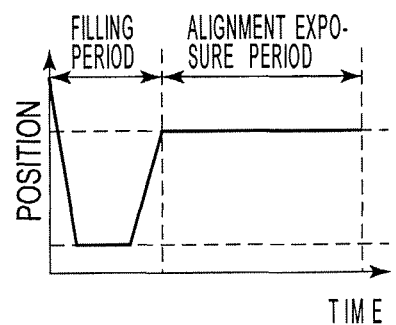
Figure 5D:
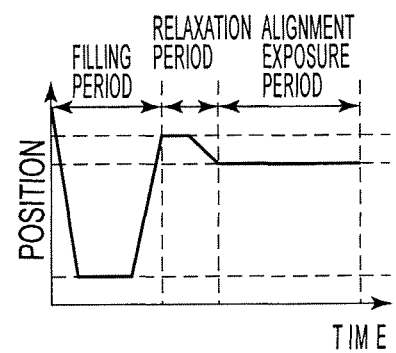

FIGS. 5C and 5D show examples in which the pressure as the control amount in FIGS. 5A and 5B is changed to a position control amount of the stage 4102 in z-direction (FIG. 4). In these examples, irregularities in pressure or processing result can be caused due to unevennesses in dimensions and mechanical constants of the mold 4105 and the work 4104, viscosity and amount of application of the resin material, positional error of the stage, deformation of the respective member due to temperature change, etc. However, in the case where the irregularities are acceptable, it is possible to omit detection of pressure and the control mechanism, so that it is possible to realize a simpler and lower-cost apparatus.

Incidentally, as the positional information used for control, another positional information obtained by directly measuring the spacing between the mold 4105 and the work 4104 or by measuring a position of another member such as the chuck or the like is also usable.

Next, detection of the filling amount in this embodiment will be described with reference to FIGS. 6A to 6C which are schematic views for illustrating a filling process of the resin material.

Figure 6A:
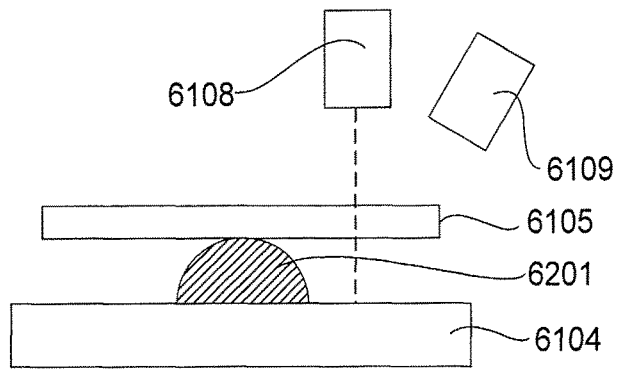
FIGS. 6A to 6C are schematic views for illustrating a filling process of a resin material in Embodiment 1 of the present invention.
Figure 6B:
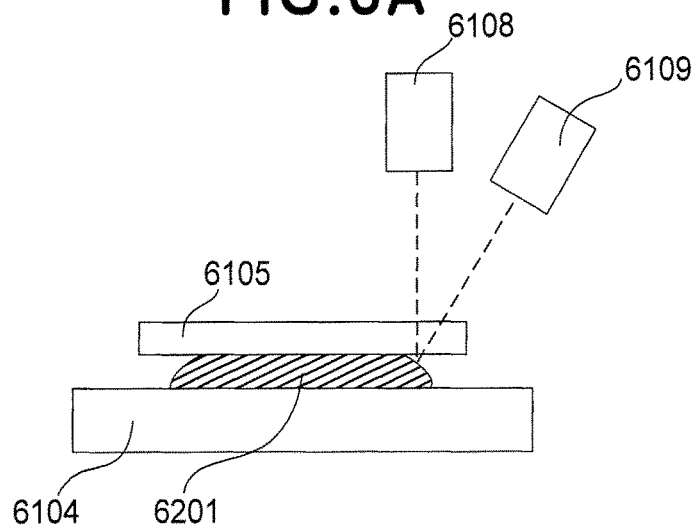
Figure 6C:
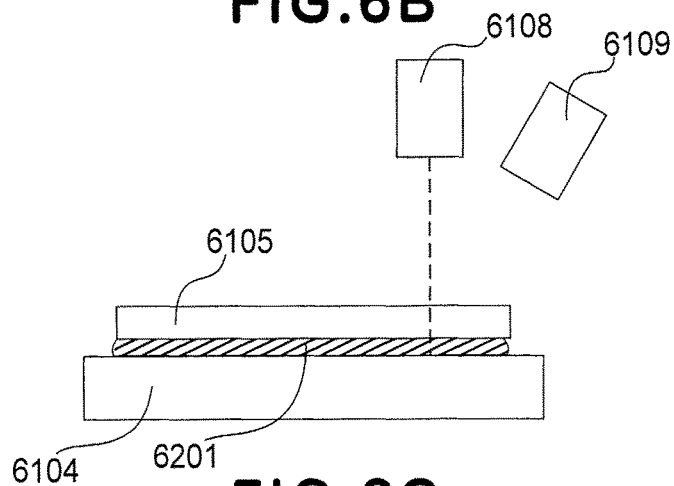

In FIGS. 6A to 6C, a reference numeral 6104 represents a work (substrate), a reference numeral 6105 represents a mold, a reference numeral 6108 represents a laser, a reference numeral 6109 represents a photodiode, and a reference numeral 6201 represents a resin material.

FIG. 6A shows a state before pressure application. Under pressure application, a state of filling of the resin material 6201 progresses to a state shown in FIG. 6C through a state shown in FIG. 6B, thus leading to completion of the filling of the resin material 6201.

In the state shown in FIG. 6A, laser light emitted from the laser 6108 is reflected at the surfaces of the mold 6105 and the work 6104 but does not enter the photodiode 6109 due to the above described arrangement of the laser 6108 and the photodiode 6109.

When the resin material filling state progresses to the state shown in FIG. 6B so that an interface between the resin material 6201 and the mold 6105 goes across the laser light, the laser light reflected and scattered at the interface enters the photodiode 6109.

When the resin material filling state further progresses to the state shown in FIG. 6C so that the interface is deviated from the laser light, the laser light entering the photodiode 6109 becomes nonexistent again.

Figure 7:
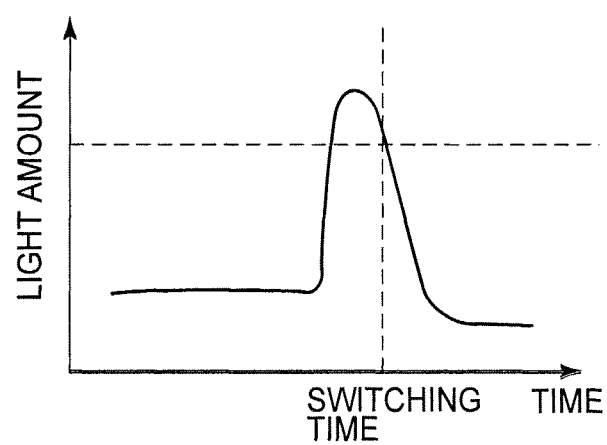
FIG. 7 is a graph showing a change with time in output signal of a photodiode in the resin material filling process in Embodiment 1 of the present invention.

FIG. 7 shows an example of a change with time of an output signal of the photodiode in the above described process.

In this embodiment, at a switching time shown in FIG. 7, a termination operation of the filling period, i.e., a decrease in pressing force is started.

Incidentally, the detection method for the filling amount is not limited to that described in this embodiment. For example, another method such that the increased range of the resin material is acquired as an image by the scope 4107 to calculate a filling amount through image processing is also applicable. It is also possible to apply such a method that the termination operation of the filling period is started after a lapse of certain time from the above mentioned detection time of the filling amount in the case where a detection point of the filling amount must be located close to a center of the mold because of an apparatus constitution and where a filling speed is low due to a characteristic of the resin material. Further, it is also possible to cease the use of the mechanism for detecting the filling amount in the cases where an irregularity in filling time is less and where a lowering in throughput or processing accuracy due to the irregularity in filling time is acceptable. For example, it is also possible to terminate the filling period by time management from the start of pressure application by means of the filling amount control circuit 4128. In this case, it is possible to omit the detection and control mechanism for the filling amount, so that a simpler and lower-cost apparatus can be realized.

Incidentally, in order to accurately perform the alignment in the in-plane direction, the alignment may preferably be performed under application of a low pressure of 0.01-0.1 MPa or a pressure lower than the low pressure.

Embodiment 2

In Embodiment 2, another constitutional example different from the constitutional example in Embodiment 1 will be described.

The difference between this embodiment and Embodiment 1 is only a difference in pressure control method, so that a common description will be omitted and only the pressure control in this embodiment will be described.

FIGS. 8A to 8D are graphs each showing a relationship between a control amount and its change with time.

FIGS. 8A to 8D correspond to FIGS. 5A to 5D, respectively. In the filling period shown in each of FIGS. 8A to 8D, the pressure is applied in a pulse form.

In this embodiment, in the filling period, the filling amount of the resin material is detected similarly as in Embodiment 1 and subsequent pressure application is stopped, at a time (point) when the detected filling amount reaches a reference value, to effect switching to the alignment exposure period.

In the pressure control method in this embodiment, the switching of period is effected at discrete timing between respective pulses, so that a control resolution of the filling amount is lowered.

However, it is possible to terminate the filling period with reliability even in the case where it is difficult to control the filling amount such as the case of large inertia of the resin material or the case of very high filling speed of the resin material, so that reliability of the processing is capable of being improved.

Figure 8A:
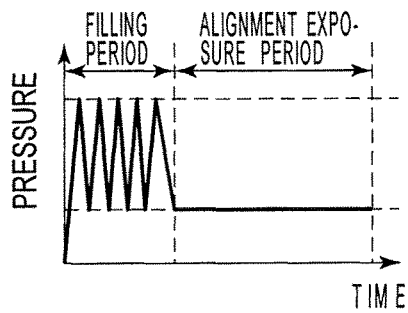
FIGS. 8A to 8D are graphs each for illustrating pressure control in Embodiment 2 of the present invention, in which an associated control amount and a change thereof with time are shown.
Figure 8B:
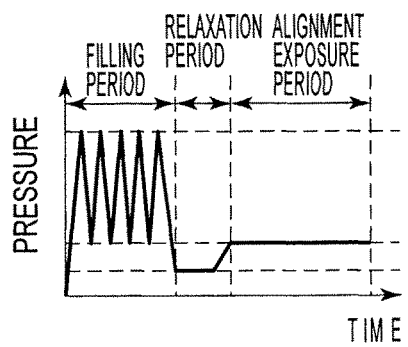
Figure 8C:
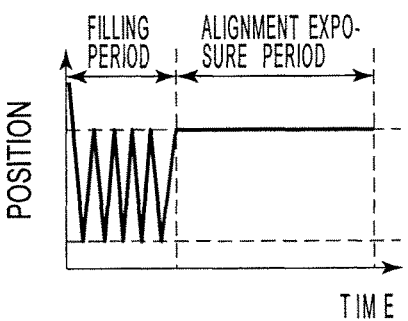
Figure 8D:
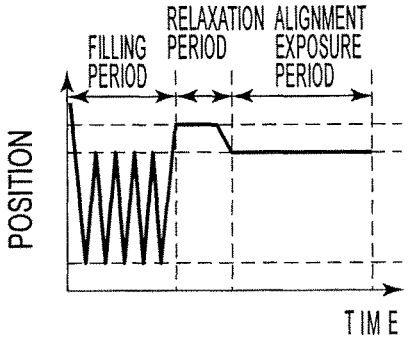

Incidentally, in FIG. 8A, a lower limit of the pressure (pressing force) in the filling period is depicted so as to be equal to the pressure value in the alignment exposure period but may also be lower or larger than the pressure value in the alignment exposure period. A difference between the lower limit of the pressure in the filling period and the pressure value in the alignment exposure period may preferably be 0-50%, more preferably 0-30%, further preferably 0-15%.

Embodiment 3

In Embodiment 3, a pressure processing method (imprint method) according to the present invention will be described.

More specifically, in the pressure processing method of this embodiment, a resin material interposed between a mold and a member to be processed is cured by applying thereto pulse-like energy from at least one of sides of the mold and the member to be processed. As a result of the curing of the resin material, it is possible to form a pattern, provided at a processing surface of the mold, on the resin material.

As the pulse-like energy, it is possible to use UV rays or laser light in the case of employing the photocurable resin material. In the case of utilizing thermal effect, it is possible to use, e.g., infrared rays.

As described above, by applying the energy for the curing in a pulse form, controllability of a curing state of the resin material is improved.

This embodiment is also applicable to Embodiment 1 and Embodiment 2 in which the control of pressure applied to the resin material is effected. The present invention also includes such a constitution that only the pressure processing method of this embodiment (Embodiment 3) is effected without performing the pressure control in Embodiment 1 or Embodiment 2.

While the invention has been described with reference to the structures disclosed herein, it is not confined to the details set forth and this application is intended to cover such modifications or changes as may come within the purpose of the improvements or the scope of the following claims.

This application claims priority from Japanese Patent Applications Nos. 302747/2005 filed Oct. 18, 2005 and 244326/2006 filed Sep. 8, 2006, which are hereby incorporated by reference.

What is claimed is:

1. An imprint apparatus for imprinting an imprint pattern of a mold onto a pattern formation material on a substrate, the imprint apparatus comprising:

a mold holding portion for holding the mold;

a substrate stage for mounting the substrate thereon;

a pressure control portion for controlling pressure applied by the mold and the substrate to the pattern formation material on the substrate;

a position adjusting portion for adjusting a positional relationship between the mold and the substrate; and an information acquisition portion for acquiring information about a contact state between the imprint pattern of the mold and the pattern formation material on the substrate, wherein the pressure control portion sets values of a first pressure and a second pressure lower than the first pressure, and changes the pressure applied by the mold and the substrate to the pattern formation material from a first pressure to a second pressure lower than the first pressure based on the basis of the information from said information acquisition portion, and wherein said position adjusting portion adjusts the positional relationship, with respect to an in-plane direction perpendicular to a direction in which the first pressure is applied, between the mold and the substrate, in a state in which the pressure applied by the mold and the substrate to the pattern formation material is the second pressure on the basis of alignment marks provided on the mold side and the substrate side.

2. An apparatus according to claim 1, further comprising an energy source for curing the pattern formation material, wherein the pattern formation material is cured at the second pressure by said energy source.

3. An apparatus according to claim 1, wherein said pressure control portion increases the first pressure and decreases the first pressure repeatedly when the imprint pattern and the pattern formation material on the substrate contact each other, and applies the second pressure, which is lower than the increased first pressure.

4. An apparatus according to claim 1, wherein the second pressure is set to be −0.1 MPa or more and 0.1 MPa or less.

5. An imprint apparatus for imprinting an imprint pattern of a mold onto a pattern formation material on a substrate, the imprint apparatus comprising:
a mold holding portion for holding the mold;
a substrate stage for mounting the substrate thereon;
a pressure control portion for controlling pressure applied by the mold and the substrate to the pattern formation material on the substrate; and
a position adjusting portion for adjusting a positional relationship between the mold and the substrate,
wherein the pressure control portion applies a first pressure by the mold and the substrate to the pattern formation material, and
wherein the position adjusting portion adjusts the positional relationship, with respect to an in-plane direction perpendicular to a direction in which the first pressure is applied, between the mold and the substrate at a second pressure lower than the first pressure in a state in which the pressure applied between the mold and the substrate to the pattern formation material is the second pressure on the basis of alignment marks provided on the mold side and the substrate side.

6. An apparatus according to claim 5, wherein the pressure control portion increases the first pressure when a contact area between the imprint pattern and the pattern formation material is increased, and the second pressure is lower than the increased first pressure.

7. An apparatus according to claim 5, wherein the pressure control portion controls the first pressure such that the first pressure is repetitively increased and decreased when a contact area between the imprint pattern and the pattern formation material is increased, and the second pressure is lower than the increased first pressure.

8. An apparatus according to claim 5, wherein the pressure control portion applies a pressure lower than the second pressure or a negative pressure between the mold and the substrate to alleviate a pressing force after the applying of the first pressure between the mold and the substrate and before the second pressure is applied.

9. An apparatus according to claim 5, wherein the pressure control portion changes the pressure applied between the mold and substrate in a pulse-like manner during the applying of the first pressure to increase a contact area between the imprint pattern and the pattern formation material.

10. An apparatus according to claim 5, wherein the second pressure is set to be −0.1 MPa or more and 0.1 MPa or less.

11. An imprint apparatus for imprinting an imprint pattern of a mold onto a pattern formation material on a substrate, the imprint apparatus comprising:
a mold holding portion for holding the mold;
a substrate stage for mounting the substrate thereon;
a load control portion for controlling load applied by the mold and the substrate to the pattern formation material on the substrate;
a position adjusting portion for adjusting a positional relationship between the mold and the substrate; and
an information acquisition portion for acquiring information about a contact state between the imprint pattern of the mold and the pattern formation material on the substrate,
wherein the load control portion sets values of a first load and a second load lower than the first load, and changes the load applied by the mold and the substrate to the pattern formation material from the first load to the second load based on the basis of the information from the information acquisition portion, and
wherein the position adjusting portion adjusts the positional relationship, with respect to an in-plane direction perpendicular to the direction in which the first load is applied, between the mold and the substrate, in a state in which the load applied by the mold and the substrate to the pattern formation material is the second load on the basis of alignment marks provided on the mold side and the substrate side.

12. An apparatus according to claim 11, wherein the second load is set to be −0.1 MPa or more and 0.1 MPa or less.

13. An imprint apparatus for imprinting an imprint pattern of a mold onto a pattern formation material on a substrate, the imprint apparatus comprising:
a mold holding portion for holding the mold;
a substrate stage for mounting the substrate thereon;
a load control portion for controlling load applied by the mold and the substrate to the pattern formation material on the substrate; and
a position adjusting portion for adjusting a positional relationship between the mold and the substrate,
wherein the load control portion applies a first load between the mold and the substrate to the pattern formation material, and
wherein the position adjusting portion adjusts the positional relationship, with respect to an in-plane direction perpendicular to the direction in which the first load is applied, between the mold and the substrate at a second load lower than the first load in a state in which the load applied between the mold and the substrate to the pattern formation material is the second load on the basis of alignment marks provided on the mold side and the substrate side.

14. An apparatus according to claim 13, wherein the second load is set to be −0.1 MPa or more and 0.1 MPa or less.

15. An imprint apparatus for imprinting an imprint pattern of a mold onto a pattern formation material on a substrate, the imprint apparatus comprising:
a mold holding portion for holding the mold;
a substrate stage for mounting the substrate thereon;
a pressure control portion for controlling pressure applied between the mold and the substrate in a direction to increase a contact area between the imprint pattern and the pattern formation material; and a position adjusting portion for adjusting a positional relationship between the mold and the substrate, wherein the pressure control portion applies a second pressure between the mold and the substrate in the direction lower than a first pressure in a state in which the imprint pattern contacts the pattern formation material, and wherein the position adjusting portion adjusts the positional relationship between the mold and substrate in an in-plane direction perpendicular to the direction of the first pressure at the second pressure on the basis of alignment marks provided on the mold side and the substrate side.

16. An apparatus according to claim 15, wherein the second pressure is set to be −0.1 MPa or more and 0.1 MPa or less.

17. An imprint apparatus for imprinting an imprint pattern of a mold onto a pattern formation material on a substrate, the imprint apparatus comprising:

a mold holding portion for holding the mold;

a substrate stage for mounting the substrate thereon;

a pressure control portion for controlling the pressure applied between the mold and the substrate;

a position adjusting portion for adjusting a positional relationship between the mold and the substrate; and an information acquisition portion for acquiring information about a contact state between the imprint pattern and the pattern formation material on the substrate and for transmitting information to pressure control portion, wherein the pressure control portion is capable of setting values of a first pressure and a second pressure lower than the first pressure and changes a pressure set value from the first pressure value to the second pressure value on the basis of the information about a contact state from the information acquisition portion, and wherein the position adjusting portion is adapted to effect the alignment control in the in-plane direction after the pressure set value is changed from the first pressure value to the second pressure value on the basis of the information.

18. An apparatus according to claim 17, wherein the second pressure is set to be −0.1 MPa or more and 0.1 MPa or less.

* * * * *